United States Patent [19]

Wagner et al.

[11] Patent Number: 4,778,583

[45] Date of Patent: Oct. 18, 1988

[54] SEMICONDUCTOR ETCHING PROCESS WHICH PRODUCES ORIENTED SLOPED WALLS

[75] Inventors: John J. Wagner, EauClaire, Wis.; Antonio R. Gallo, Rochester, N.Y.

[73] Assignee: Eastman Kodak Company, Rochester, N.Y.

[21] Appl. No.: 48,112

[22] Filed: May 11, 1987

[51] Int. Cl.[4] .................... C23C 14/04; C23C 14/16
[52] U.S. Cl. ......................... 204/192.37; 156/643; 156/646; 156/647
[58] Field of Search .............. 204/192.32, 192.37; 156/643, 647, 646

[56] References Cited

U.S. PATENT DOCUMENTS

| | | | |
|---|---|---|---|
| 3,880,684 | 4/1975 | Abe | 204/192.32 X |
| 3,984,301 | 10/1976 | Matsuzaki et al. | 204/192.32 |
| 4,352,724 | 10/1982 | Sugishima et al. | 204/192 E |
| 4,465,553 | 8/1984 | Hijikata et al. | 204/192.32 X |
| 4,680,086 | 7/1987 | Thomas et al. | 156/646 X |
| 4,698,128 | 10/1987 | Berglund et al. | 156/643 |
| 4,702,795 | 10/1987 | Douglas | 156/646 X |
| 4,717,447 | 1/1988 | Dieleman et al. | 204/192.37 X |
| 4,733,823 | 3/1988 | Waggener et al. | 156/547 X |
| 4,741,799 | 5/1988 | Chen et al. | 156/646 X |

OTHER PUBLICATIONS

Kinoshita et al., "Anisotropic Etching of Silicon by Gas Plasma", Japan J. Appl. Phys., vol. 16, 1977, No. 2, pp. 381 and 382.

*Primary Examiner*—Donald R. Valentine
*Attorney, Agent, or Firm*—Raymond L. Owens

[57] ABSTRACT

A method is disclosed of forming a semiconductor device including performing a dry plasma etch at one major surface of a monocrystalline silicon substrate to form a sloped lateral wall lying in a selected crystallographic plane intersecting one major surface. The oriented sloped lateral wall is formed during plasma etching by introducing into contact with said major surface at unprotected locations a chlorofluorocarbon gas and employing during etching a pressure of at least 6.67 Pa and a radio frequency power density of less than 3 watts per square centimeter.

10 Claims, 1 Drawing Sheet

SEMICONDUCTOR ETCHING PROCESS WHICH PRODUCES ORIENTED SLOPED WALLS

FIELD OF THE INVENTION

This invention is directed to a process of fabricating a silicon semiconductor device. More specifically, this invention is directed to a process of producing sloped lateral walls in such semiconductor devices.

BACKGROUND OF THE INVENTION

In manufacturing monocrystalline silicon semiconductor devices it is common practice to begin with a slice of monocrytalline silicon referred to as a wafer and to fabricate one or more devices from the wafer. In a wide variety of differing forms the monocrystalline silicon elements of the devices produced exhibit laterally sloping side walls. The typical way of forming such laterally sloping side walls is by etching.

Typically etching is performed by masking selected areas so that an etchant is free to contact the monocrystalline silicon substrate in the remaining areas. When isotropic etching is performed, the silicon substrate is removed in a directionally nonselective manner. The limitations of isotropic etching can be illustrated by reference to FIG. 1. A monocrystalline silicon substrate 100 is shown provided with parallel, opposed upper and lower major surfaces 101 and 103. To permit etching a conventional masking layer 105 providing an opening 107 is formed on the upper major surface. An isotropic etchant reaching the silicon substrate through the opening removes silicon at an approximately equal rate in all directions. This forms the channel 109 shown.

Isotropic etching produces a number of disadvantages. First, the width of the etch channel is typically wider than the width of the opening in the masking layer. Slight variances in the duration of etching can result in variances in the width of the etch channel. Second, isotropic etching undercuts the masking layer. Undercutting poses an undesirable feature for many subsequent stages of device manufacture. Third, despite being sloped the lateral walls of the etch channel still intersect the upper major surface of the substrate at a high angle, approaching 90 degrees. The high angle of intersection is recognized to present a point of potential weakness where, following masking layer removal, continuous layers are intended to bridge the upper major surface and the channel surface.

The problem of undercutting has been minimized if not obviated by developing anisotropic etching techniques. FIG. 2 illustrates an ideal anisotropic etch. A monocrystalline silicon substrate 200 is shown provided with parallel, opposed upper and lower major surfaces 201 and 203. To permit etching a conventional masking layer 205 providing an opening 207 is formed on the upper major surface. An anisotropic etchant reaching the silicon substrate through the opening removes silicon unidirectionally so that the lateral walls 209 of the etch channel are aligned with the edges of the masking layer opening.

Anisotropic etching avoids or at least minimizes the undercutting problem of isotropic etching. It is not a useful etching approach for forming sloped lateral walls for a semiconductive substrate. Further, the angle of intersection between the upper major surface of the substrate and the etch channel remains undesirably high.

Sugishima et al U.S. Pat. No. 4,352,734 summarizes a variety of conventional isotropic and anisotropic etch techniques for monocrystalline silicon substrates.

Kinoshita et al, "Anisotropic Etching of Silicon by Gas Plasma", Japan J. Appl. Phys., Vol. 16, 1977, No. 2, pp. 381 and 382, reports a form of etching which differs from both conventional isotropic and anisotropic etching. By using carbon tetrachloride to form a gaseous plasma a sloping surface intersecting the major surface of a monocrystalline silicon substrate at an angle of 45 to 50 degrees was formed. Since the silicon substrate major surface lay in a {100} crystallographic plane, it was speculated that the sloped surface formed by etching lay in a {111} crystallographic plane, despite the well established fact that {111} and {100} crystallographic planes intersect at an angle of 54.74°. Experiments with halofluorocarbon and fluorocarbon gases failed to show any etch rate perference as a function of crystallographic direction.

SUMMARY OF THE INVENTION

In one aspect the present invention is directed to a method of forming a semiconductor device including performing a dry plasma etch at one major surface of a monocrystalline silicon substrate to form a sloped lateral wall intersecting the one major surface comprising (a) selectively protecting a portion of the major surface, (b) positioning the substrate on one of two spaced electrodes, (c) providing a gaseous atmosphere between the electrodes, and (d) establishing an electric field between the electrodes capable of creating a plasma in said gaseous atmosphere.

The method of the present invention is in one aspect particularly characterized in that the sloped lateral wall is oriented along a selected crystallographic plane of the monocrystalline silicon substrate by (e) introducing into contact with the major surface at unprotected locations a chlorofluorocarbon gas and (f) employing during etching a pressure of at least 6.67 Pa and a ratio frequency power density of less than 3 watts per square centimeter.

The present invention offers a variety of distinct advantages. As compared to isotropic etching, undercutting is avoided. As compared to both isotropic and anisotropic etching lower angles of intersection between the sloped lateral walls formed by etching and the major surface of the monocrystalline silicon substrate are realized. As compared to the carbon tetrachloride etching of Kinoshita et al, cited above, etching gases can be used which are known to exhibit a higher rate of etching than carbon tetrachloride. In addition, the shape of the etch channel and the angle of intersection with the major surface of the substrate can be controlled in a manner not appreciated by Kinoshita et al.

BRIEF DESCRIPTION OF THE DRAWINGS

These and other advantages of this invention can be better appreciated by reference to the following detailed description of the invention considered in conjunction with the drawings, in which.

DESCRIPTION OF PREFERRED EMBODIMENTS

The etching process of the present invention is fundamentally different from conventional isotropic and anisotropic etching processes in that the rate of etching is retarded. This allows directional preferences of the monocrystalline silicon substrate being etched to exercise control over the orientation of the sloping channel walls formed by etching. The configuration of the etch channel is a function of both controlling the rate and duration of etching.

Figure 1:
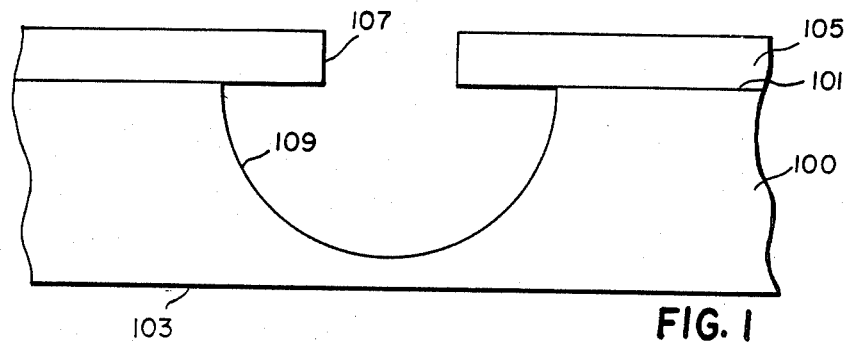
FIGS. 1 and 2 are schematic sectional views of monocrystalline silicon substrates immediately following etching by conventional isotropic and anisotropic procedures, respectively.
Figure 2:
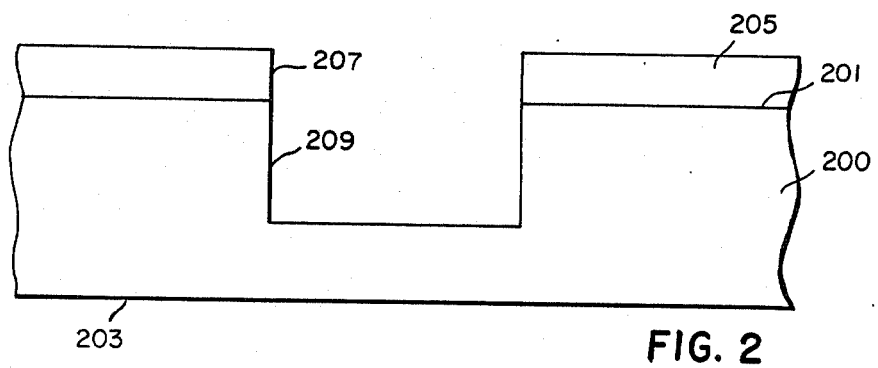
Figure 3:
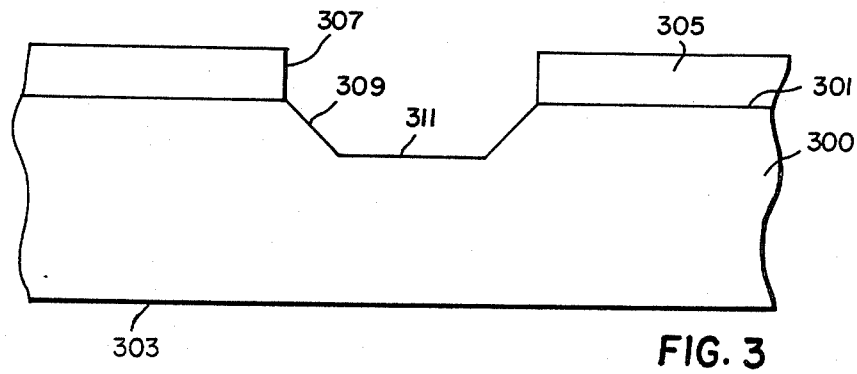
FIGS. 3 and 4 are schematic sectional views of monocrystalline silicon substrates at differing stages of etching by the procedure of this invention.

This is illustrated by reference to FIGS. 3 through 4. In FIG. 3 a monocrystalline silicon substrate 300 is shown having opposed parallel upper and lower major surfaces 301 and 303 lying in {100} crystallographic planes. Overlying the upper major surface is a masking layer 305 defining an opening 307. By etching through the opening at a retarded rate according to the present invention an etch channel is initially formed having sloped side walls 309 and a bottom wall 311 parallel to the major surfaces. The bottom wall lies in a {100} crystallographic plane while the sloped side walls each lie in a {111} crystallographic plane.

When etching is begun, the etchant readily attacks the silicon lying in the {100} crystallographic plane. However, once the etchant encounters the {111} crystallographic planes defined by the side walls, the rate of attack is substantially lower, since the silicon surfaces presented by {111} crystallographic planes are significantly more stable than those presented by {100} crystallographic planes or any other crystallographic plane found in silicon. As etching continues the more stable crystallographic planes begin to account for a larger proportion of the total channel wall structure, since the etchant is preferentially removing the silicon at the {100} crystallographic planes.

Figure 4:
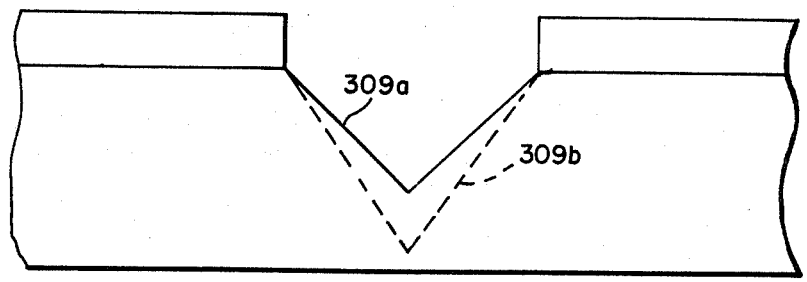

If etching is continued and the thickness of the substrate is sufficient to accommodate the necessary depth of the channel, eventually a vee shaped channel configuration is achieved as shown in FIG. 4. In this figure the etch channel is formed entirely by the sloped side walls 309a lying in {111} crystallographic planes. All of the silicon lying along a {100} crystallographic plane has been removed.

If the acute angle of intersection of the sloped side walls 309 and 309a with the major surface of the substrate are measured, they are observed to form an angle of $54.74° \pm X°$, where X represents the range of experimental error in measurement. Even without undertaking great care in ascertaining the angle of measurement, X is in all instances less than 5°. The thickness of the substrate necessary to permit a channel having only {111} crystallographic plane surfaces is a function of the width of the opening and can be readily calculated.

When etching according to the invention is allowed to proceed after the sloping walls of the etch channel have converged, a further change in the configuration of the etch channel can be achieved. With continued etching new side walls emerge which differ from the side walls 309 and 309a in that they do not lie in {111} crystallographic planes. Instead they intersect the upper major surface of the substrate at increasingly higher angles of intersection. It is possible to form sloped side walls which lie in higher index crystallographic planes, such as {322}, {211}, {311}, etc. crystallographic planes. Resulting higher index crystallographic plane side walls 309b are indicated by dashed lines in FIG. 4.

An important point to note in each of FIGS. 3 through 4 is that the width of the channel formed by etching is in all instances coextensive with the width of the opening in the masking layer. Stated another way, the width of the opening in the masking layer pins the edges of the etch channel. This allows the width of the etch channel to be more easily controlled, thereby increasing the uniformity of the etch channels produced. Further, the problem of undercutting of the masking layer is avoided.

In the foregoing discussion the results achieved in the practice of this invention have been described in terms of a monocrystalline silicon substrate having major faces lying in {100} crystallographic planes. The semiconductor art normally employs silicon wafers of this crystallographic orientation. However, there is no reason in theory that the major faces should be restricted to any particular crystallographic plane. Once etching begins, the {111} planes will still emerge. However, if the major faces lie in a crystallographic plane other than a {100} plane, the angle of intersection of the sloped lateral walls with the major faces of the substrate will, of course, be altered. For example, if the major surface of the monocrystalline silicon substrate lies in a {110} crystallographic plane, then the angle of intersection of the sloped lateral walls lying in {111} crystallographic planes is reduced to $35.26° \pm X°$, where X is as previously defined.

In FIGS. 1 through 4 only the cross section of the etch channel is shown, since the lateral extent of the etch channel along the one major surface of the substrate can take any conventional form. In one common form the etch channel can be formed to define peripheral boundaries of individual semiconductor elements to be fabricated from the silicon wafer. The individual semiconductor elements can have a peripheral form or any convenient polygonal peripheral form. The opening or openings in the masking layer are configured to form the etch channel configuration and hence device configuration desired.

The etch channels described above having sloped side walls are formed by employing conventional dry etching with gaseous plasma, but with the rate of etching markedly retarded in relation to conventional etching processes. For example, whereas conventional isotropic and anisotropic etching is measured in matter of seconds, etching by the process of the present invention is usually measured in terms of minutes.

An approach to achieving suitably restrained etching allowing the described etch channels to be produced is to employ chlorofluorocarbon gases. Chlorofluorocarbons are molecules containing only chlorine, fluorine, and carbon atoms. The simplest chlorofluorocarbon gases are chlorofluoromethanes—i.e., trichlorofluoromethane, dichlorodifluoromethane, and chlorotrifluoromethane. Plasma forming chlorine and fluorine substituted higher homologue alkanes, such as ethane and propane, are, of course, contemplated.

To maintain control of etching a radio frequency power density of less than 3 watts per square centimeter ($W/cm^2$). Limiting the power density limits the energy imparted to the plasma, thereby controlling the rate of etching. While power densities can be varied, preferred power densities are in the range of from 0.3 to 3 $W/cm^2$.

A second control on the rate of etching is achieved by maintaining a chlorofluorocarbon gas plasma pressure of at least 6.67 Pa. Maintenance of pressure above a minimum threshold limits the mean free path of excited gas molecules between collisions and thereby regulates the kinetic energy of these molecules in contacting the substrate surface to be etched. While pressure of the vacuum chamber in which the plasma is generated can be varied, a preferred working pressure range is from about 25 to 70 Pa.

The materials employed to form the masking layer on the monocrystalline silicon substrate can take any convenient conventional form. Either positive or negative working photoresists can be employed. Silicon dioxide masking layers can be formed. The silicon dioxide can be either grown oxide or chemical vapor deposited oxide, often referred to as low temperature oxide or LTO, since it is deposited at temperatures below those used to produce grown oxide. Silicon nitride masking layers are also contemplated. Metal layers, such as aluminum, can also be used as masking layers.

Aside from the features which are modified to retard the rate of chlorofluorocarbon etching, conventional plasma etching equipment and procedures can be employed. The silicon wafer to be etched is typically located on a water cooled conductive pedestal in a vacuum chamber. The conductive pedestal serves as a driving electrode for plasma generation while a second electrode or the conductive walls of the vacuum chamber can act as a counter electrode. A very simple approach to providing a counter electrode is simply to ground the conductive walls of the vacuum chamber or the grid (also referred to as a shower head) used to guide gas introduction into the plasma area of the vacuum chamber. The total power supplied divided by the area of the upper surface of the driving electrode determines the power density. When a plasma is generated, the wafer spontaneously develops a D.C. bias of a few volts, depending upon the choice of gases. Occasionally a D.C. bias between the silicon wafer and the supporting driving electrode is employed, but this is not required. The radio frequency employed for generating the plasma can range from a few kilohertz well into the megahertz range. The actual frequency choice is usually dictated by F.C.C. frequency assignments rather than considerations of operability. For this reason, the most commonly employed frequency for plasma etching is 13.56 megahertz. Conventional details of plasma etching equipment and procedures are illustrated by Mogab U.S. Pat. No. 4,211,601, Bhagat et al U.S. Pat. No. 4,222,838, and Pan U.S. Pat. No. 4,417,947, here incorporated by reference.

EXAMPLES

The invention can be further appreciated by reference to the following examples.

Wafer Preparation

N or P type monocrystalline silicon waters 10 cm in diameter with major faces oriented in either a {100} or {111} crystallographic plane were employed as substrates for the examples which follow. In accordance with conventional practice the wafers were generally circular, with one major flat edge oriented along a crystallographic plane for convenience in orientation.

The wafers were in each instance cleaned using a conventional wet cleaning method. This comprises a distilled water rinse followed by dipping the wafer in ammonium hydroxide, then phosphoric acid, then hydrofluoric acid, then hydrogen peroxide, and then phosphoric acid again. The wafers were then rinsed with distilled water and spun until dry in a nitrogen atmosphere.

Mask A—Photoresist Masking Layers

Just prior to coating with a photoresist the wafers were scrubbed with an emulsion of water, soap, and surfactant and rinsed using deionized water. The scrubbed wafers were subjected to a dehydration bake at 250° C. for 60 seconds in nitrogen. The wafers were then treated with hexamethyldisilazane (HMDS) to promote photoresist adhesion.

A positive working photoresist of the type disclosed in Example 1 of Daly et al U.S. Pat. No. 4,365,019 was applied to the surface of each wafer. The wafer was spun to produce a thin 1.3 $\mu$m photoresist film. Each wafer with the photoresist film in place was baked at 125° C. for 45 seconds to eliminate solvents.

Each photoresist coated wafer was pattern exposed on a conventional stepper or projection aligner using approximately 600 mW/cm$^2$ of 436 nm radiation. The pattern chosen for some wafers consisted of parallel lines and spaces of varying pitches ranging from 1.0 to 10.0 $\mu$m. The pattern chosen for other wafers consisted of concentric squares having line widths and pitches varied within the same ranges as the lines and spaces of the first described pattern. From 35 to 60 percent of the total upper surface of each wafer was given a photoresist pattern as described.

After exposure the photoresist layer was in each instance developed using a conventional developer commercially available under the trademark KTI Zx-934. Developing was performed for 50 seconds using a puddle technique with a subsequent spin, rinse with deionized water, and spin dry. Each wafer was given a postbake at 137° C. for 60 seconds.

At the conclusion each wafer was visually inspected and determined to contain photoresist only in intended pattern areas.

Mask B—LTO Masking Layers

The wafers to receive LTO coatings were placed in a furnace and brought to a wafer temperature of 420° C. Silicon hydride (SiH$_4$) and oxygen in a 1:2 volume ratio were allowed to flow over the wafers for about one half hour.

The wafers with LTO surface films were then provided with photoresist masks by the procedure described above under the topic Mask A. The unprotected LTO surface film of the photoresist patterned wafers were then etched with a high selectivity silicon dioxide etch in a parallel plate single wafer plasma etcher with a 10 to 50 mm electrode gap using a standard C$_2$F$_6$ and CHF$_3$ gas composition at a pressure of 46.4 to 133 Pa and a frequency of 13.56 megahertz. This removed the LTO in areas not protected by the photoresist. The pattern forming photoresist was thereafter removed in a batch type barrel etcher using a pure oxygen plasma. The wafers were left with a patterned masking layer of highly anisotropic LTO.

Mask C—Aluminum Masking Layers

The wafers to receive aluminum masking layers were coated with 0.85 $\mu$m aluminum (containing 1 percent by weight silicon) in a batch deposition system using argon ion sputtering from an aluminum target.

The aluminum coated wafers were then provided with photoresist masks by the procedure described above under the topic Mask A. The unprotected aluminum layer of the photoresist patterned wafers was etched in a parallel plate single wafer plasma etcher using chlorine, boron trichloride, and chloroform gases at a pressure of 13.3 to 39.9 Pa, a frequency of 13.56 megahertz, and a power density of 0.5 to 1.0 W/cm². This removed the aluminum in areas not protected by the photoresist. The pattern forming photoresist was thereafter removed in a batch type barrel etcher using a pure oxygen plasma. The wafers were left with a patterned aluminum masking layer.

Silicon Substrate Etching

The wafers with Masks A, B, and C were etched in the following manner:

The wafer was placed on a circular water cooled stainless steel pedestal serving as a driving electrode in a vacuum chamber. The counter electrode was provided by a grounded shower head also serving as an interior wall of the vacuum chamber defining the area of plasma generation. The driving and counter electrodes were spaced 39 mm apart. Process gases were introduced and regulated by separate mass flow controllers into a common manifold for proper mixing prior to reaching the shower head. Pressure control was achieved by a stream of nitrogen introduced into the vacuum pump line, thereby changing the vacuum pump's effective speed. There was an induction period of about 15 seconds between the start of gas flow and the application of a 13.56 megahertz radio frequency field across the electrodes. Power densities applied, based on the circular upper surface of the stainless steel driving electrode, ranged from 0.65 to 2.8 W/cm². The driving electrode was maintained at a constant 23° C. by water cooling.

The gases used were CCl₃F or CCl₂F₂. The pressure in the vacuum chamber during etching was varied from 24.2 to 54.4 Pa. Etch times were varied from 6 to 45 minutes, depending on the power density employed and the depth sought for the etch channel being formed.

Side Wall Slope as a Function of Channel Width

A wafer having opposed major surfaces lying in {100} crystallographic planes and photoresist Mask A was etched using CCl₃F gas, a power density of 0.6 W/cm², a pressure of 40 Pa, and an etching time of 20 minutes. The slopes of the side walls of etch channels of various widths were measured and compared to the known angle of crystallographic plane intersection. The results are summarized below in Table I.

TABLE I

| | Width of Etch Channel μm | | | | | |
|---|---|---|---|---|---|---|
| | 1.5 | 2 | 3 | 4 | >10 | Edge |
| Depth μm | 2.6 | 2.5 | 2.5 | 1.9/2.4* | 1.4/1.9* | 2.45 |
| Observed Angle | 71.5 | 64 | 60.5 | 54 | 53 | 56 |
| Theor. Angle | 72.45 | 65.91 | 60.98 | 54.74 | 54.74 | 54.74 |
| Crystal Plane | {311} | {211} | {322} | {111} | {111} | {111} |

*Curved bottom wall

The edge column refers to an etch channel formed to extend to one edge of the wafer. Thus, only one sloped lateral wall was formed. The sloped wall of the edge channel correlated well with the expected slope of a {111} crystallographic plane, indicating the the sloped lateral wall lay in such a plane.

The >10 column refers to an etch channel of such extended width that effects due to convergence of lateral walls should not have been in evidence. Again there was a close correspondence of the measured angle of slope of the side wall an known angle of intersection of a {111} crystallographic plane. The sloped lateral wall extended to a depth of 1.4 μm below the major surface of the wafer. The lower wall of the etch channel was not flat, but rather concave, extending to a depth of 1.9 μm.

The 4 μm width etch channel was similar in configuration to the edge and >10 μm etch channels, indicating convergence of the lateral walls was not having an effect on the orientation of the sloped lateral walls. In other words, all of these etch channels were in a stage of formation corresponding to that described above in connection with FIG. 3.

The narrower etch channels of 3, 2, and 1 μm in width on the other hand, based on the steeper angles of the sloped lateral walls, appeared to have reached a formation stage corresponding to that described above in connection with channel 309b FIG. 4. Nevertheless, the orientation of each sloped lateral wall is noted to correlate well with a known angle of intersection of a higher index crystallographic plane.

This example demonstrates the feasibility of producing etch channels with sloped lateral walls having orientations corresponding to known orientations of crystallographic planes.

Varied Formation Conditions for Two Micrometer Etch Channels

In Table II below the results are summarized below for a number of wafers, masks, and etch conditions.

TABLE II

| Gas | Power Density W/cm² | Pressure Pa | Time min | Depth mμ | Mask | Major Face | Obs. Angle | Nearest Angle | Theor. Plane |
|---|---|---|---|---|---|---|---|---|---|
| CCl₃F | 2.2 | 29.3 | 6 | 1 | A | {100} | 59 | 60.98 | {322} |
| CCl₃F | 2.2 | 29.3 | 7 | 1.2 | A | {100} | 57 | 57.69 | {321} |
| CCl₃F | 2.2 | 29.3 | 9 | 1.5 | A | {100} | 62 | 60.98 | {322} |
| CCl₃F | 2.2 | 29.3 | 12 | 2.0 | A | {100} | 61 | 60.98 | {322} |
| CCl₃F | 2.2 | 29.3 | 3 | 0.5 | A | {111} | 57.5 | 54.74 | {110} |
| CCl₃F | 2.2 | 29.3 | 7 | 1.3 | A | {111} | 53.8 | 54.74 | {110} |
| CCl₃F | 2.2 | 29.3 | 10 | 1.8 | A | {111} | 55.6 | 54.74 | {110} |
| CCl₃F | 0.6 | 46.7 | 15 | 1.3 | A | {100} | 62.2ᵃ | 60.98 | {322} |
| CCl₃F | 0.6 | 46.7 | 15 | 1.3 | A | {100} | 56.5ᵇ | 57.69 | {321} |
| CCl₃F | 0.6 | 46.7 | 30 | 1.3 | A | {100} | 66 | 65.91 | {211} |
| CCl₂F₂ | 0.6 | 39.9 | 30 | 2.8 | A | {100} | 64 | 65.91 | {211} |
| CCl₂F₂ | 0.6 | 60 | 20 | 1.2 | C | {100} | 70 | 70.53 | {221} |
| CCl₃F | 2.2 | 30.6 | 12 | 0.5 | B | {100} | 67 | 65.91 | {211} |

TABLE II-continued

| Gas | Power Density W/cm² | Pressure Pa | Time min | Depth mμ | Mask | Major Face | Obs. Angle | Nearest Angle | Theor. Plane |
|---|---|---|---|---|---|---|---|---|---|
| CCl₃F | 1.1 | 40 | 30 | 3.54 | A | {100} | 66 | 65.91 | {211} |

$^a$measured at top of sloped wall (nearest major face)
$^b$measured at bottom of sloped wall (furthest from major face)

The orientations of the sloped lateral walls where measured agreed well with known angles of intersection of {322} and {321} crystallographic planes. Table II demonstrates the feasibility of varying the chlorofluorocarbon etchant, the power density of etching, and the pressure of the vacuum chamber within the limits of the invention. Varied etch times, channel depths, and masks further illustrate the flexibility of the etching process of the invention.

The invention has been described in detail with particular reference to preferred embodiments thereof, but it will be understood that variations and modifications can be effected within the spirit and scope of the invention.

What is claimed is:

1. A method of forming a semiconductor device including performing a dry plasma etch at one major surface of a monocrystalline silicon substrate to form a constant sloped lateral wall intersecting said one major surface comprising
   selectively protecting a portion of said major surface,
   positioning said substrate on one of two spaced electrodes,
   providing a gaseous atmosphere between said electrodes, and
   establishing an electric field between said electrodes capable of creating a plasma in said gaseous atmosphere,
   characterized in that said sloped lateral wall is oriented along a selected crystallographic plane of said monocrystalline silicon substrate by introducing into contact with said major surface at unprotected locations a chlorofluorocarbon gas which, when formed into a plasma crystallographically etches monocrystalline silicon and
   employing during etching a pressure of at least 6.67 Pa and a radio frequency power density of less than 3 watts per square centimeter.

2. A method according to claim 1 further characterized in that said gas is a chlorofluoromethane gas.

3. A method according to claim 2 further characterized in that said chlorofluoromethane gas is trichlorofluoromethane gas.

4. A method according to claim 3 further characterized in that said chlorofluoromethane gas is dichlorodifluoromethane gas.

5. A method according to claim 1 further characterized in that said pressure is maintained in the range of from 25 to 70 Pa.

6. A method according to claim 1 further characterized in that said power density is maintained in the range of from 0.3 to 3 watts per square centimeter.

7. A method according to claim 1 further characterized in that said major surface is protected by a patterned photoresist.

8. A method according to claim 1 further characterized in that said major surface is protected by a patterned silicon oxide or nitride.

9. A method according to claim 1 further characterized in that said major surface is protected by a patterned metal.

10. A method according to claim 9 further characterized in that said patterned metal is aluminum.

* * * * *